United States Patent
Lv et al.

(10) Patent No.: US 7,903,421 B2
(45) Date of Patent: Mar. 8, 2011

(54) LOCKING DEVICE AND ELECTRONIC DEVICE USING THE SAME

(75) Inventors: Zheng-Wen Lv, Shenzhen (CN); Meng Fu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tucheng, Taipei County (TW)

( * ) Notice: Subject to any disclaimer, the term of this patent is extended or adjusted under 35 U.S.C. 154(b) by 81 days.

(21) Appl. No.: 12/497,715

(22) Filed: Jul. 6, 2009

(65) Prior Publication Data

US 2010/0239385 A1 Sep. 23, 2010

(30) Foreign Application Priority Data

Mar. 21, 2009 (CN) .......................... 2009 1 0301010

(51) Int. Cl.
*H05K 7/20* (2006.01)
*F28F 7/00* (2006.01)
*H01L 23/34* (2006.01)

(52) U.S. Cl. ........ 361/719; 165/80.2; 165/185; 257/719; 361/704

(58) Field of Classification Search .................. 257/719; 361/719

See application file for complete search history.

(56) References Cited

U.S. PATENT DOCUMENTS

| | | | | |
|---|---|---|---|---|
| 6,307,748 | B1* | 10/2001 | Lin et al. | 361/704 |
| 7,126,823 | B2* | 10/2006 | Chen et al. | 361/702 |
| 7,675,753 | B2* | 3/2010 | Li et al. | 361/719 |
| 7,808,791 | B2* | 10/2010 | Li et al. | 361/719 |
| 2007/0091576 | A1* | 4/2007 | Wung et al. | 361/719 |
| 2008/0037225 | A1* | 2/2008 | Yang | 361/719 |
| 2008/0101031 | A1* | 5/2008 | Barsun et al. | 361/719 |
| 2009/0185351 | A1* | 7/2009 | Li et al. | 361/719 |
| 2009/0266512 | A1* | 10/2009 | Lu | 165/80.3 |

* cited by examiner

*Primary Examiner* — Gregory D Thompson
(74) *Attorney, Agent, or Firm* — Frank R. Niranjan

(57) ABSTRACT

An electronic device comprises a printed circuit board, a heat sink and a plurality of locking devices securing the heat sink to the printed circuit board. Each locking device comprises a shaft, a knob and an elastic member. The shaft has a plurality of outer teeth protruding outwardly from an outer surface of a top end thereof. The outer teeth are arranged along an axial direction of the shaft. The knob has an inner tooth meshing with the outer teeth of the shaft. The elastic member is compressed between a bottom of the knob and the heat sink. A length of the elastic member changes when the inner tooth of the knob meshes with different outer teeth along the axial direction of the shaft to adjust a pressure of the locking device on the heat sink.

17 Claims, 4 Drawing Sheets

LOCKING DEVICE AND ELECTRONIC DEVICE USING THE SAME

BACKGROUND

1. Technical Field

The disclosure relates to an electronic device and, more particularly, to an electronic device having a locking device securing a heat sink to an electronic component mounted a printed circuit board.

2. Description of Related Art

With the increasing development of computer technology, electronic components mounted on a printed circuit board such as central processing units (CPUs) of computers are being made to operate at higher operational speeds and to have greater functional capabilities. When an electronic component operates at a high speed, it frequently generates large amounts of heat. The heat must be quickly removed from the electronic component to prevent it from becoming unstable or being damaged. Typically, a heat sink is attached to an outer surface of the electronic component to absorb heat from the electronic component. The heat absorbed by the heat sink is then dissipated to ambient air.

In order to keep the heat sink in intimate contact with the electronic component, a locking device is used to secure the heat sink to the electronic component. A typical locking device comprises a pin and a spring disposed around the pin. The pin has a head at an end thereof and a clamping portion at an opposite end thereof. The clamping portion has an anchor-shaped cross-section, and includes a pair of hooks extending upwardly and outwardly from a bottom thereof towards two opposite sides thereof. A tab extends upwardly from an inner side of each hook. The pin of the locking device passes through the heat sink and the printed circuit board. The spring is compressed between the head of the pin and the heat sink to produce a spring force. The spring force makes the hooks of the clamping portion tightly clamping a bottom face of the printed circuit board, whereby the heat sink is attached to the electronic component.

In use, the locking device provides a certain pressure on the heat sink so as to mount the heat sink on the printed circuit board. When the locking device is used for mounting another heat sink needing a different pressure thereon, it difficulty fits for the another heat sink; that is, the locking device has a poor universality.

What is needed, therefore, is an electronic device having a locking device which can overcome the problem mentioned above.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
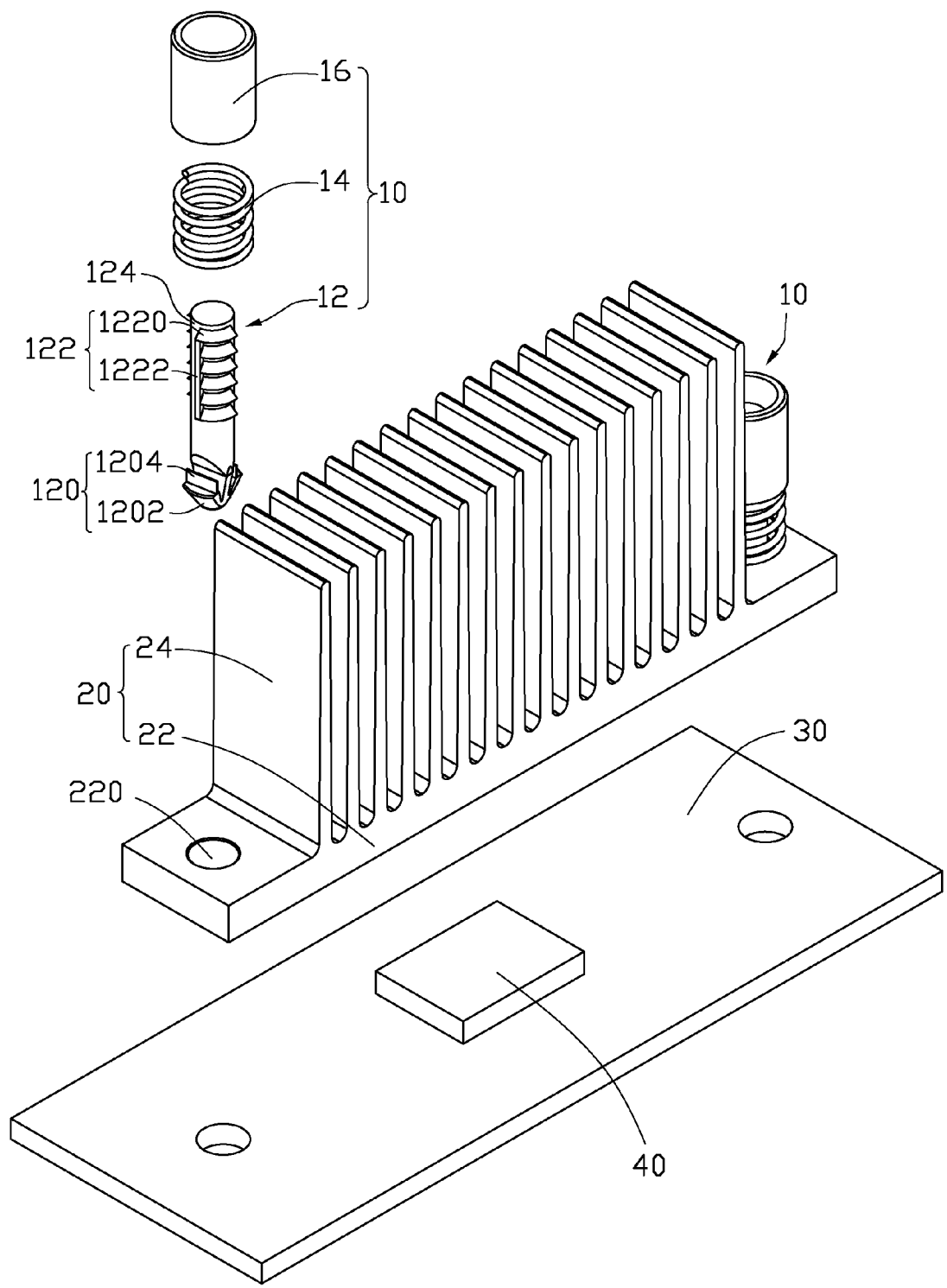
FIG. 1 is an isometric, exploded view of an electronic device in accordance with an embodiment of the disclosure.

Referring to FIG. 1, an electronic device is illustrated in accordance with an embodiment of the disclosure. The electronic device comprises a printed circuit board 30, a heat sink 20 and a plurality of locking devices 10 attaching the heat sink 20 to an electronic component 40 mounted on the printed circuit board 30. The heat sink 20 dissipates heat generated by the electronic component 40 to ambient air.

The heat sink 20 is formed by metal having a high thermal conductivity, such as copper or aluminum. The heat sink 20 comprises a flat base 22 and a plurality of spaced, parallel fins 24 extending upwardly and perpendicularly from a top surface of the base 22. No fins are disposed at two opposite ends of the base 22. Two through holes 220 are respectively defined at the two opposite ends of the base 22 for extension of two locking devices 10.

The printed circuit board 30 defines two extending holes (not labeled) which are corresponding to the through holes 220 of the heat sink 20. The locking devices 10 in sequence extend through the through holes 220 and the extending holes to secure the heat sink 20 to the electronic component 40.

Each of the locking devices 10 comprises a shaft 12, an elastic member 14 coiled around the shaft 12 and a knob 16 meshing with a top end of the shaft 12. The elastic member 14 is a helical spring in this embodiment.

The shaft 12 of the locking device 10 is integrally made of plastic material. It is well known to a person skilled in the art that the locking device 10 can also be made of metal. The shaft 12 is columnar, and comprises a clamping portion (not labeled) disposed at a bottom end thereof and an engaging portion 122 disposed at the top end thereof for meshing with the knob 16. In this illustrated embodiment, the clamping portion is a clasp 120 having an anchor-shaped cross-section. The clamping portion is not limited to be a clasp; it can also be a screwed connection or other suitable fixing devices for fixing the heat sink 20 on the printed circuit board 30.

The clasp 120 has a maximum outer diameter thereof greater than that of the through hole 220 of the heat sink 20 and that of the extending hole of the printed circuit board 30, whereby the clasp 120 clasps a bottom surface of the printed circuit board 30 after the clasp 120 in sequence extends through the through hole 220 and the extending hole. The clasp 120 comprises a pair of hooks 1202 extending upwardly and outwardly from a bottom thereof towards two opposite sides thereof. A tab 1204 extends upwardly from an inner side of each hook 1202. A width of the tab 1204 is slightly greater than the diameter of the extending hole defined in the printed circuit board 30 so that the tab 1204 can abut against an inner surface of the printed circuit board 30 defining the extending hole. A slot (not labeled) is formed by the shaft 12 and located neighboring an inside of each hook 1202 so that the hooks 1202 can be deformed elastically when they are compressed towards each other to extend through the through hole 220 and the extending hole of the printed circuit board 30.

The engaging portion 122 comprises a plurality of outer teeth 1220 protruding outwardly from an outer surface of the shaft 12. The outer teeth 1220 cooperatively define two vertical passages 124 (best to see FIG. 3) at two opposite sides of the shaft 12 for extension of the knob 16. The passages 124 are symmetric about an axis of the shaft 12. An amount of the passages 124 is not limited to be two, and it can also be changed in other embodiments. The outer teeth 1220 are spaced from each other to define gaps therebetween. The outer teeth 1220 are parallel to each other and perpendicular to the axis of the shaft 12. The outer teeth 1220 are divided into two columns by the passages 124. A strip-like stop 1222 connects ends of the outer teeth 1220 in each column at one of two lateral sides thereof. In this embodiment, the engaging portion 122 has two stops 1222 each connecting the ends of the outer teeth 1220 in each of the two columns. The two stops 1222 are diametrically opposite to each other. In another embodiment, the engaging portion 122 only has one stop 1222 disposed at the ends of the outer teeth 1220 in one column.

Figure 2:
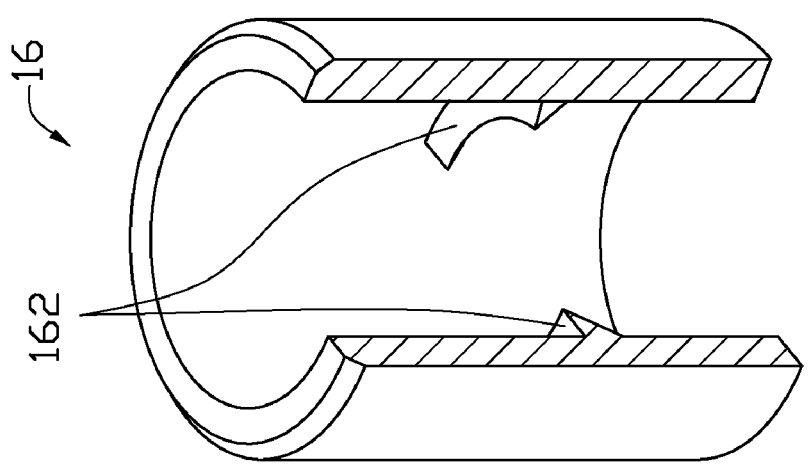
FIG. 2 is a cross-sectional view of a knob of a locking device of the electronic device of FIG. 1.

Referring to FIG. 2, the knob 16 is a hollow cylinder. A plurality of inner teeth 162 protrude inwardly from an inner surface of the knob 16. An amount of the inner teeth 162 is identical to that of the passages 124 of the outer teeth 1220 of the engaging portion 122. In this embodiment, the amount of the inner teeth 162 is two. The two inner teeth 162 are symmetric about an axis of the knob 16 and are in a same horizontal plane. The inner teeth 162 are parallel to the outer teeth 1220. A distance between the inner teeth 162 and a top end of the knob 16 is predetermined according to actual needs. In this embodiment, the distance is half a height of the knob 16. A thickness of each inner tooth 162 is less than a distance of the gap between two adjacent outer teeth 1220 so that the inner teeth 162 can selectively slide into the gaps between corresponding adjacent outer teeth 1220 and have ends abutting against the stops 1222 disposed at the ends of the outer teeth 1220 when the knob 16 is rotated relative to the shaft 12 after inner teeth 162 have be moved along a direction from top to bottom of the shaft 12 along the passages 124 of the outer teeth 1220 to a selected position.

Figure 3:
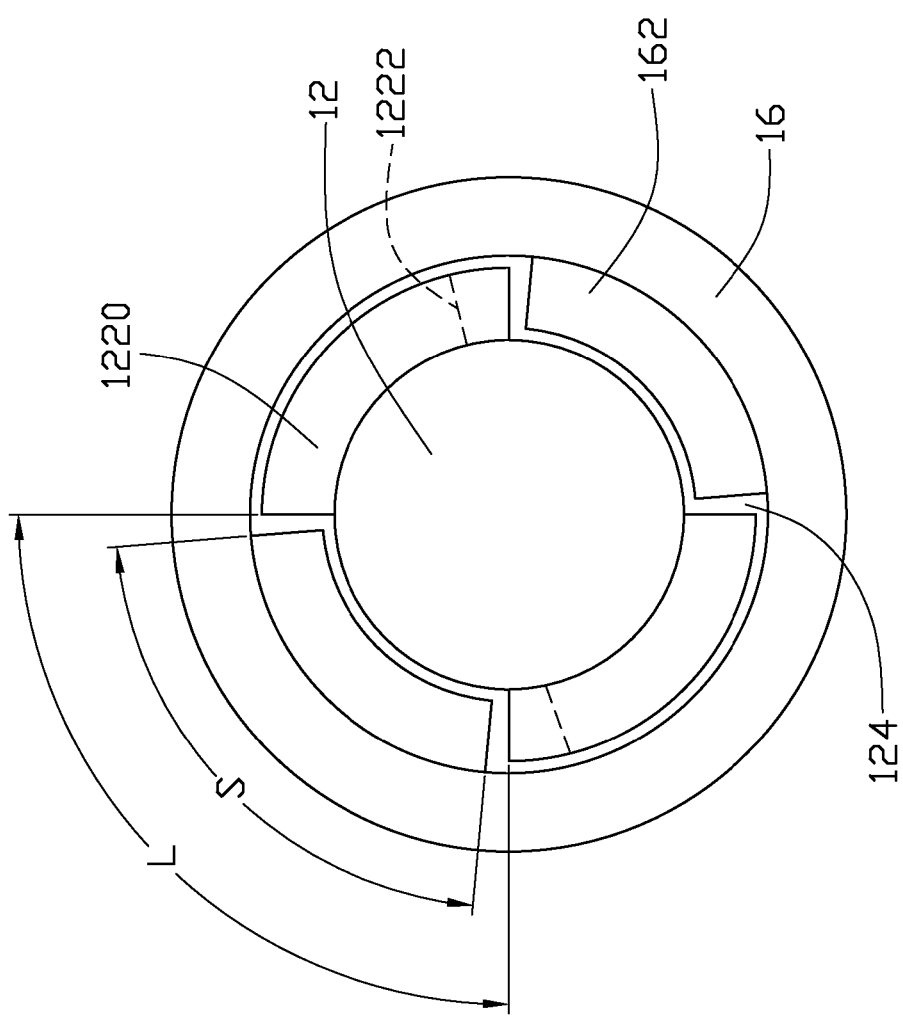
FIG. 3 is a top view showing a shaft of the locking device of FIG. 1 unlocking with the knob.
Figure 4:
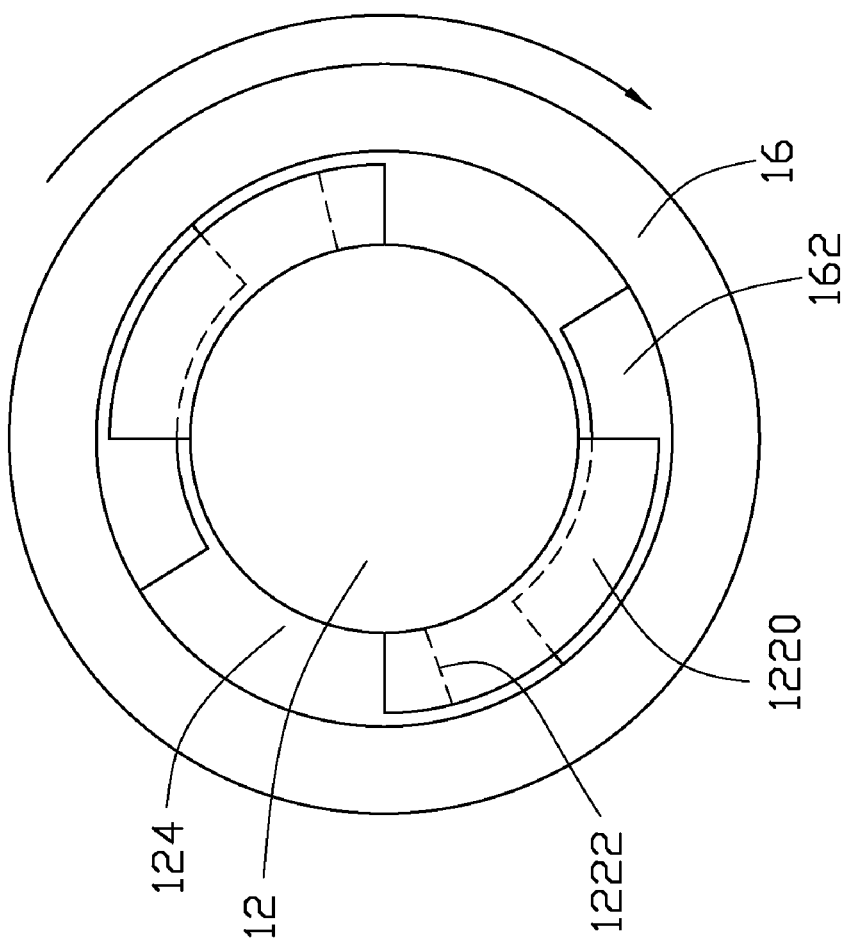
FIG. 4 is a view similar to FIG. 3, showing the shaft locking with the knob.

Referring to FIGS. 3-4, in order to introduce in detail an engagement process of the engaging portion 122 of the shaft 12 and the knob 16, arc length S stands for an extending length of each inner tooth 162 in the inner surface of the knob 16. Extending length L stands for a length of each passage 124 extending along a circumferential direction. The arc length S is less than the extending length L so that the inner teeth 162 can move along the direction from the top to the bottom of the shaft 12 along the passages 124.

In assembly of the locking device 10, the clasp 120 extends downwardly through the base 22 of the heat sink 20 and the printed circuit board 30, and clasps the bottom surface of the printed circuit board 30. The elastic member 14 is coiled around the shaft 12 and above the base 22 of the heat sink 20. The two inner teeth 162 of the knob 16 are brought to move downwardly along the passages 124, and are selectively aligned with the gaps between the corresponding adjacent outer teeth 1220, and then are rotated relative to the shaft 12 by rotating the knob 16 to thereby slide into the gaps until the two inner teeth 162 are stopped by the stops 1222 of the engaging portion 122. At the same time, the elastic member 14 is compressed between the bottom of the knob 16 and the base 22 of the heat sink 20 to provide a certain amount of pressure on the heat sink 20 so that the heat sink 20 can have an intimate contact with the electronic component 40. Meanwhile, the resilient force generated by the elastic member 14 causes the inner teeth 162 of the knob 16 to mesh tightly with upper ones of the corresponding outer teeth 1220 of the shaft 12. When the locking device 10 is used for mounting another heat sink which needs a different pressure from the pressure that the heat sink 20 needs, the inner teeth 162 of the knob 16 can be moved to mesh with other outer teeth 1220 of the shaft 12 to provide a desired pressure on the another heat sink. Therefore, the locking device 10 can be adjusted to generate different pressures suitable for different heat sinks, whereby it has a better universality.

Alternatively, the stops 1222 are not disposed at the engaging portion 122 but disposed at ends of the inner teeth 162 of the knob 16. In this alternative situation, when the inner teeth 162 slide into gaps between adjacent outer teeth 1220, the inner teeth 162 will lock at a desired position when the stops at the inner teeth 162 of knob engage with ends of the adjacent outer teeth 1220 located at entrances of the gaps, thereby avoiding the inner teeth 162 from sliding beyond the corresponding outer teeth 1220. In order to avoid the inner teeth 162 from sliding beyond the corresponding outer teeth 1220, there are many other means which can be utilized such as only one stop 1222 being disposed at the engaging portion 122 or only one stop 1222 being disposed at the end of one of the inner teeth 162.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A locking device for securing a heat sink to a printed circuit board, the locking device comprising:
    a shaft having a plurality of outer teeth protruding outwardly from an outer surface of a top end thereof, and a clamping portion disposed at a bottom end thereof, the outer teeth being arranged one by one along an axial direction of the shaft;
    a knob having an inner tooth protruding inwardly from an inner surface thereof, the knob being mounted around the top end of the shaft, the inner tooth meshing with a selective one of the outer teeth of the shaft; and
    an elastic member coiled around the shaft and located under the knob;
    wherein a length of the elastic member changes when the inner tooth of the knob meshes with another one of the outer teeth of the shaft different from the selective one of the outer teeth after the knob has been moved along the axial direction of the shaft for thereby adjusting a pressure of the locking device on the heat sink.

2. The locking device as claimed in claim 1, wherein the outer teeth of the shaft are spaced from each other, a gap being formed between two adjacent outer teeth, a distance of the gap being larger than a thickness of the inner tooth of the knob.

3. The locking device as claimed in claim 2, wherein a passage is defined on the shaft along the axial direction of the shaft for movement of the inner tooth of the knob on the shaft along the axial direction from the position where the inner tooth of the knob meshes with the selective one of the outer teeth to the position where the inner tooth of the knob meshes with the another one of the outer teeth of the shaft.

4. The locking device as claimed in claim 3, wherein the knob has another inner tooth protruding inwardly from the inner surface thereof, the shaft forms another passage along the axial direction of the shaft for movement of the another inner tooth on the shaft along the axial direction.

5. The locking device as claimed in claim 4, wherein the inner teeth of the knob are symmetric about an axis of the knob, the passages of the outer teeth being symmetric about an axis of the shaft.

6. The locking device as claimed in claim 1, wherein a stop is located between two adjacent outer teeth, the inner tooth of the knob abutting against a corresponding stop when the inner tooth meshes with one of the selective one and the another one of the outer teeth of the shaft.

7. The locking device as claimed in claim 1, wherein a stop is formed at an end of the inner tooth, the stop abutting an end of a corresponding outer tooth when the inner tooth meshes with one of the selective one and the another one of the outer teeth of the shaft.

8. The locking device as claimed in claim 1, wherein the outer teeth of the shaft are parallel to each other, the inner tooth of the knob being parallel to the outer teeth.

9. The locking device as claimed in claim 8, wherein each of the outer teeth is perpendicular to an axis of the shaft.

10. The locking device as claimed in claim 9, wherein the clamping portion comprises a pair of hooks extending upwardly and outwardly from a bottom thereof to two opposite sides thereof, a tab extending upwardly from an inner side of each hook.

11. The locking device as claimed in claim 1, wherein the elastic member is a helical spring.

12. An electronic device comprising:
   a printed circuit board having an electronic component mounted thereon;
   a heat sink mounted on the electronic component for absorbing heat from the electronic component; and
   a plurality of locking devices securing the heat sink to the printed circuit board, each of the locking devices comprising:
      a shaft having a plurality of outer teeth protruding outwardly from an outer surface of a top end thereof, and a clamping portion disposed at a bottom end thereof, the outer teeth being arranged one by one along an axial direction of the shaft, the clamping portion engaging a bottom surface of the printed circuit board;
      a knob having an inner tooth protruding inwardly from an inner surface thereof, the knob being mounted around the top end of shaft, the inner tooth meshing with a corresponding one of the outer teeth of the shaft; and
      an elastic member coiled around the shaft and located under the knob and compressed between the knob and the heat sink;
      wherein a length of the elastic member changes when the inner tooth of the knob meshes with a different one of the outer teeth after the knob is moved along the axial direction of the shaft to adjust a pressure of the locking device exerted on the heat sink.

13. The electronic device as claimed in claim 12, wherein the clamping portion of each locking device extends through the heat sink and the printed circuit board and to clasp the bottom surface of the printed circuit board, the elastic member being compressed between the knob and a place of the heat sink where the locking device extends through the heat sink.

14. The electronic device as claimed in claim 13, wherein the outer teeth of the shaft of each locking device are spaced from each other, a gap being formed between two adjacent outer teeth, a distance of the gap being larger than a thickness of the inner tooth of the knob of each locking device.

15. The electronic device as claimed in claim 14, wherein the shaft forms a passage along an axial direction of the shaft for movement of the inner tooth of the knob on the shaft along the axial direction of the shaft.

16. The electronic device as claimed in claim 12, wherein a stop is located between two adjacent ones of the outer teeth for abutting the inner tooth of the knob.

17. The electronic device as claimed in claim 12, wherein a stop is formed at an end of the inner tooth of the knob for abutting an end of a corresponding one of the outer teeth.

* * * * *